(12) United States Patent
Ledden et al.

(10) Patent No.: US 12,313,699 B1
(45) Date of Patent: May 27, 2025

(54) SYSTEMS AND METHODS FOR MONITORING ELECTRICAL SYSTEMS OF MARINE VESSELS

(71) Applicant: Brunswick Corporation, Mettawa, IL (US)

(72) Inventors: John T. Ledden, Edgewater, FL (US); Robert P. Macias, Merritt Island, FL (US)

(73) Assignee: Brunswick Corporation, Mettawa, IL (US)

( * ) Notice: Subject to any disclaimer, the term of this patent is extended or adjusted under 35 U.S.C. 154(b) by 416 days.

(21) Appl. No.: 17/586,376

(22) Filed: Jan. 27, 2022

Related U.S. Application Data

(63) Continuation-in-part of application No. 16/936,849, filed on Jul. 23, 2020, now abandoned.

(51) Int. Cl.
*G01R 31/52* (2020.01)
*B63J 3/00* (2006.01)
*G01R 31/58* (2020.01)
*B63J 3/04* (2006.01)

(52) U.S. Cl.
CPC ............... *G01R 31/52* (2020.01); *B63J 3/00* (2013.01); *G01R 31/58* (2020.01); *B63J 2003/002* (2013.01); *B63J 2003/043* (2013.01)

(58) Field of Classification Search
CPC .. G01R 31/52; G01R 31/58; B63J 3/00; B63J 2003/002; B63J 2003/043
USPC .......................................................... 307/84
See application file for complete search history.

(56) References Cited

U.S. PATENT DOCUMENTS

| | | | |
|---|---|---|---|
| 6,342,775 B1 | 1/2002 | Sleder, Sr. | |
| 6,652,330 B1 | 11/2003 | Wasilewski | |
| 6,724,589 B1* | 4/2004 | Funderburk | G01R 31/52 361/45 |
| 7,218,118 B1 | 5/2007 | Gonring | |
| 8,043,132 B1 | 10/2011 | Wyant | |
| 8,068,937 B2* | 11/2011 | Eaves | H02H 3/30 307/62 |
| 8,608,521 B1 | 12/2013 | Snyder et al. | |
| 8,725,329 B1 | 5/2014 | Snyder et al. | |
| 8,836,544 B1 | 9/2014 | Balogh | |
| 9,054,555 B1 | 6/2015 | Ward | |
| 9,362,838 B1 | 6/2016 | Balogh et al. | |
| 9,533,747 B2 | 1/2017 | Arbuckle et al. | |
| 10,573,098 B2 | 2/2020 | Mash | |
| 2007/0220907 A1* | 9/2007 | Ehlers | F25B 49/005 62/126 |
| 2012/0182024 A1* | 7/2012 | Ike | G01R 31/52 324/509 |
| 2016/0241017 A1* | 8/2016 | Schroeder | H02H 7/263 |

(Continued)

*Primary Examiner* — Richard Tan
(74) *Attorney, Agent, or Firm* — Andrus Intellectual Property Law, LLP

(57) ABSTRACT

An electrical system for a marine vessel. The electrical system includes a power supply that produces an output. A powered device is electrically coupled to the power supply, where the powered device receives an incoming power from the power supply. An analysis module determines a difference between the output of the power supply and the incoming power received by the powered device. The analysis module compares the determined difference to a first threshold and generates a first signal when the determined difference exceeds the first threshold.

15 Claims, 5 Drawing Sheets

(56) References Cited

U.S. PATENT DOCUMENTS

2017/0207746 A1* 7/2017 Yoscovich .............. H02S 50/00
2020/0174055 A1* 6/2020 Pampattiwar ........ H04B 10/035

* cited by examiner

SYSTEMS AND METHODS FOR MONITORING ELECTRICAL SYSTEMS OF MARINE VESSELS

CROSS REFERENCE TO RELATED APPLICATIONS

This application is a continuation-in-part of U.S. patent application Ser. No. 16/936,849, filed Jul. 23, 2020, which is incorporated herein by reference in its entirety.

FIELD

The present disclosure generally relates to electrical systems for marine vessels.

BACKGROUND

The following U.S. Patents provide background information and are incorporated by reference in entirety.

U.S. Pat. No. 6,652,330 discloses a method for controlling the electrical system of a marine vessel that includes the steps of measuring a battery potential, comparing the battery potential to a threshold voltage magnitude, and then disconnecting one or more of a plurality of electrical power consuming devices when the voltage potential is less than the threshold voltage magnitude. This is done to avoid the deleterious condition wherein an engine of the marine vessel is operating at idle speed and attempting to charge the battery while a plurality of electrical power consuming devices are operating and drawing sufficient current from the alternator to prevent the proper charging of the battery. In these circumstances, the battery potential can be depleted as the battery attempts to provide the additional required electrical current for the loads.

U.S. Pat. No. 6,342,775 discloses a battery switching circuit that provides a mechanism by which a plurality of electrical storage batteries can be alternatively connected in parallel or series based on the position of a manually controlled joystick of a marine positioning and maneuvering system. When the joystick is in a neutral position in which no docking motion is demanded by the marine vessel operator, the storage batteries are connected in parallel so that they can benefit from charging by an alternator or generator associated with an internal combustion engine. If the joystick is moved out of its neutral position, the batteries are immediately connected in series to provide power to a plurality of electric motors that are used to drive a plurality of impellers of the docking system.

U.S. Pat. No. 9,533,747 discloses a hybrid propulsion system that has an internal combustion engine and an electric motor that each selectively powers a marine propulsor to propel a marine vessel. A plurality of batteries discharges current to power the motor. A controller is programmed to aggregate the recharge and/or discharge limits of plurality of batteries and then operate the system according to a method that preferably prevents internal fault and disconnection of batteries in the plurality.

U.S. Pat. No. 7,218,118 discloses a method for monitoring the condition of a battery of a marine propulsion system that provides the measuring of a voltage characteristic of the battery, comparing the voltage characteristic to a preselected threshold value, and evaluating the condition of the battery as a function of the relative magnitudes of the voltage characteristic and the threshold value. The voltage characteristic of the battery is measured subsequent to a connection event when a connection relationship between the battery and an electrical load is changed.

SUMMARY

This Summary is provided to introduce a selection of concepts that are further described below in the Detailed Description. This Summary is not intended to identify key or essential features of the claimed subject matter, nor is it intended to be used as an aid in limiting the scope of the claimed subject matter.

One embodiment of the present disclosure generally relates to an electrical system for a marine vessel. The electrical system includes a power supply that produces an output. A powered device is electrically coupled to the power supply, where the powered device receives an incoming power from the power supply. An analysis module determines a difference between the output of the power supply and the incoming power received by the powered device. The analysis module compares the determined difference to a first threshold and generates a first signal when the determined difference exceeds the first threshold.

Another embodiment generally relates to a method for monitoring an electrical system for a marine vessel. The method includes providing a power supply that produces an output and electrically coupling a plurality of powered devices to the power supply. An incoming power is determined for each of the plurality of powered devices received. Differences between the output of the power supply and the incoming power received by each of the plurality of powered devices are determined. The differences determined are compared to a first threshold and a first signal is generated when one of the determined differences exceeds the first threshold.

Another embodiment generally relates to an electrical system for a marine vessel having a user interface. A power supply produces an output. A plurality of powered devices are electrically coupled to the power supply via a plurality of lines. The plurality of powered devices each receive an incoming power from the plurality of lines. An analysis module is electrically coupled to the power supply and to the plurality of powered devices. The analysis module is configured to determine differences between the output of the power supply and the incoming power received by each of the plurality of powered devices. The analysis module further compares each of the determined differences to a first threshold and generates a first signal when one of the determined differences exceeds the first threshold. The first signal is configured to cause a message to appear on the user interface indicating which of the plurality of powered devices corresponds to the incoming power having the difference to the output of the power supply exceeding the first threshold.

Various other features, objects and advantages of the disclosure will be made apparent from the following description taken together with the drawings.

BRIEF DESCRIPTION OF THE DRAWINGS

The present disclosure is described with reference to the following Figures. The same numbers are used throughout the Figures to reference like features and like components.

DETAILED DESCRIPTION

In the present description, certain terms have been used for brevity, clarity, and understanding. No unnecessary limitations are to be implied therefrom beyond the requirement of the prior art because such terms are used for descriptive purposes only and are intended to be broadly construed. The different systems and methods described herein may be used alone or in combination with other systems and methods. Various equivalents, alternatives, and modifications are possible.

Figure 1:
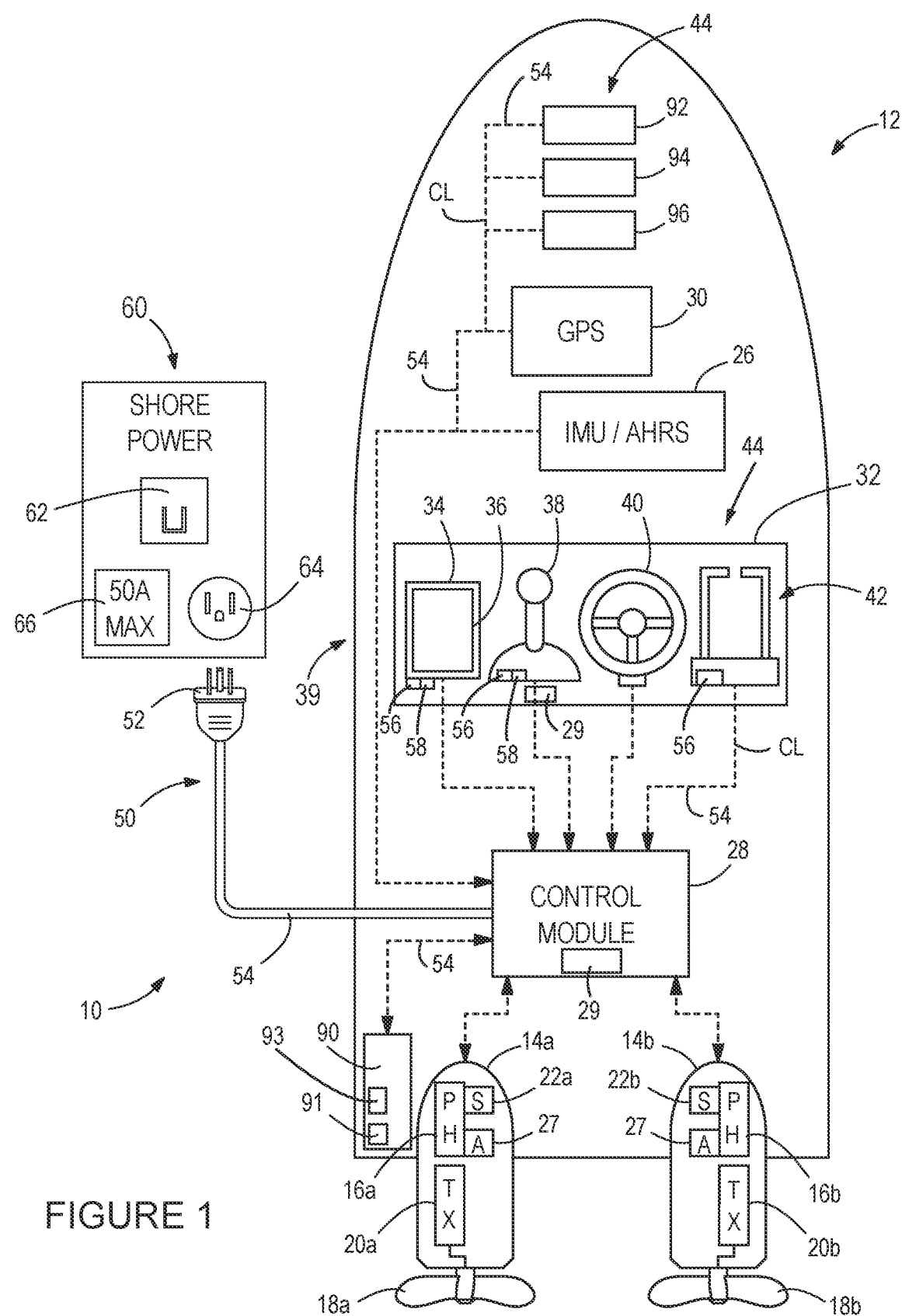
FIG. 1 depicts one embodiment of a marine vessel including an electrical system according to the present disclosure.

FIG. 1 illustrates an electrical system 10 for a marine vessel 12 according to the present disclosure. The marine vessel 12 has two marine propulsion devices 14a, 14b, though other quantities of marine propulsion devices could be provided. The marine propulsion devices 14a, 14b are shown as outboard motors, but could instead be inboard motors, stern drives, pod drives, jet drives, etc. Each marine propulsion device 14a, 14b includes a powerhead 16a or 16b, which may include an internal combustion engine (e.g., a gasoline or diesel engine), and/or an electric motor.

With continued reference to FIG. 1, each marine propulsion device 14a, 14b also includes a propeller 18a or 18b configured to be coupled in a torque-transmitting relationship with a respective powerhead 16a or 16b. Such torque-transmitting relationship is more specifically provided by way of a transmission 20a or 20b configured to transmit torque from a respective powerhead 16a or 16b to a respective propeller 18a or 18b. Each transmission 20a, 20b is configured to transmit torque from the powerhead 16a or 16b to the propeller 18a or 18b at one of at least a first gear ratio and a second gear ratio, although additional gear ratios could be provided. Alternatively, a single forward gear ratio may be provided. The marine propulsion devices 14a, 14b further includes powerhead speed sensors 22a, 22b measuring a speed of a respective powerhead 16a, 16b. In one example, the powerhead speed sensors 22a, 22b may be shaft rotational speed sensors (e.g., tachometers), which measure a speed of the powerhead 16a or 16b in rotations per minute (RPM), as is known to those having ordinary skill in the art.

The marine vessel 12 includes a number of operator input devices located at the helm 32 of the marine vessel 12, which control operation of the marine vessel 12 via control module 28 in a manner known in the art. For example, the control module 28 may control the shifting of a gear for one or more propulsion devices, steer, or turn on lights for the marine vessel 12. Additional information regarding the control module 28 is provided below.

With continued reference to FIG. 1, operator input devices may include powered devices 44, and/or devices that are not powered (such as analog gauges or devices, such as an analog speedometer or tachometer). The operator input devices of FIG. 1 includes a multi-functional display device 34 having a user interface 36. The user interface 36 may be an interactive, touch-capable display screen, a keypad, a display screen and keypad combination, a track ball and display screen combination, or any other type of user interface known to those having ordinary skill in the art for communicating with a multi-functional display device 34.

With continued reference to FIG. 1, a joystick 38 is also provided at the helm 32 and allows an operator of the marine vessel 12 to command the marine vessel 12 to translate or rotate in any number of directions. A steering wheel 40 is provided for providing steering commands to the marine propulsion devices 14a, 14b or to a rudder. A throttle lever 42 is also provided for providing thrust commands, including both a magnitude and a direction of thrust, to a control module 28. Two throttle levers are shown for the throttle lever 42, each of which can be used to control one of the marine propulsion devices 14a or 14b, although the two levers can be controlled together as a single lever. Alternatively, a single lever could be provided for controlling both marine propulsion devices 14a, 14b (and/or other numbers of levers and propulsion devices). The throttle levers 42, steering wheel 40, and joystick 38 shown here are drive-by-wire and steer-by-wire type systems, and thus each constitute powered devices 44 within the electrical system 10 of the marine vessel 12.

Certain operator input devices at the helm 32 can be used to input an operator demand for the powerheads 16a, 16b via the control module 28, for example the user interface 36 of the multi-functional display device 34, the joystick 38, and the throttle lever 42. By way of example, a rotation of the throttle lever 42 in a forward direction away from its neutral, detent position could be interpreted as a value from 0% to 100% operator demand corresponding via an input/output map, such as a look up table, to a position of the throttle valves of the powerheads 16a, 16b.

Additional powered devices 44 shown within the electrical system 10 of FIG. 1 include a global positioning system (GPS) 30 and an inertial measurement unit (IMU) or an attitude and heading reference system (AHRS) 26. The GPS 30 provides a location and a speed of the marine vessel 12 to the control module 28. An inertial measurement unit (IMU) has a solid state, rate gyro electronic compass that indicates the heading of the marine vessel 12, as well as solid state accelerometers and angular rate sensors that sense the marine vessel's attitude and rate of turn. The AHRS 26 provides 3D orientation of the marine vessel 12 by integrating gyroscopic measurements, accelerometer data, and magnetometer data. One or more of the powerheads 16a, 16b or other components of the marine propulsion devices 14a, 14b may also be powered devices 44, including in the case of the powerheads being electric propulsors, for example.

With continued reference to FIG. 1, a power supply 90 provides power throughout the electrical system 10, which is used for powering the powered devices 44 discussed above. Additional information regarding power supplies presently known in the is provided in the U.S. Patents referenced in the Background section. When the marine vessel 12 is away from shore, the power supply 90 distributes power produced by on-board generator 93, a battery 91 (or other energy storing devices known in the art), and/or an alternator 27 provided with the marine propulsion devices 14a, 14b. The alternators 27 generates power via rotation of the powerheads 16a, 16b in a manner known in the art.

While docked, power may also or alternatively be supplied by shore power connections. In the example of FIG. 1, power is provided from a shore power station 60 to the power supply 90 aboard the marine vessel 12 via an incoming connection 50 comprised of a plug 52 and line 54. In the example shown, the shore power station 60 includes a receptacle 64 configured to receive the plug 52 of the incoming connection 50 of the marine vessel 12, as well as a switch 62 for selectively providing power to the incoming connection 50. In certain examples, a maximum current label 66 is also provided with the shore power station 60, which indicates to the operator the maximum current that may be drawn from the shore power station 60 under nominal conditions.

Whether at sea or docked on shore, the power supply 90 supplies the electrical system 10 with power for operating the various powered devices 44 throughout the marine vessel 12. As discussed below, the control module 28 may be configured to provide communication and control of power flowing between the powered devices 44 in the marine vessel 12. The control module 28 is programmable and includes a processing system and a memory system (discussed further below) that can be located anywhere in the marine vessel 12. The control module 28 communicates with various components of the marine vessel 12 via a peripheral interface and wired and/or wireless links, as will be explained further herein below. Although FIG. 1 shows one control module 28, two or more control modules 28 may be provided. Portions of the methods disclosed herein below can be carried out by a single control module or by several separate control modules. For example, the marine vessel 12 can have control modules 28 located at or near a helm 32 and also located at or near the marine propulsion devices 14a, 14b. If more than one control module is provided, each can control operation of a specific device or sub-system on the marine vessel.

In some examples, the control module 28 may include a computing system that includes a processing system, storage system, software, and input/output (I/O) interfaces for communicating with peripheral devices. The systems may be implemented in hardware and/or software that carries out a programmed set of instructions. As used herein, the term "control module" may refer to, be part of, or include an application specific integrated circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip (SoC). A control module may include memory (shared, dedicated, or group) that stores code executed by the processing system. The term "code" may include software, firmware, and/or microcode, and may refer to programs, routines, functions, classes, and/or objects. The term "shared" means that some or all code from multiple control modules may be executed using a single (shared) processor. In addition, some or all code from multiple control modules may be stored by a single (shared) memory. The term "group" means that some or all code from a single control module may be executed using a group of processors. In addition, some or all code from a single control module may be stored using a group of memories.

The control module 28 communicates with one or more components of the marine vessel 12 via the I/O interfaces and a communication link, which can be a wired or wireless link. In one example, the communication link is a controller area network (CAN) bus, but other types of links could be used, such as a local interconnect network (LIN). It should be noted that the extent of connections of the communication link shown herein is for schematic purposes only, and the communication link in fact provides communication between the control module 28 and each of the peripheral devices noted herein, although not every connection is shown in the drawing for purposes of clarity.

Figure 2:
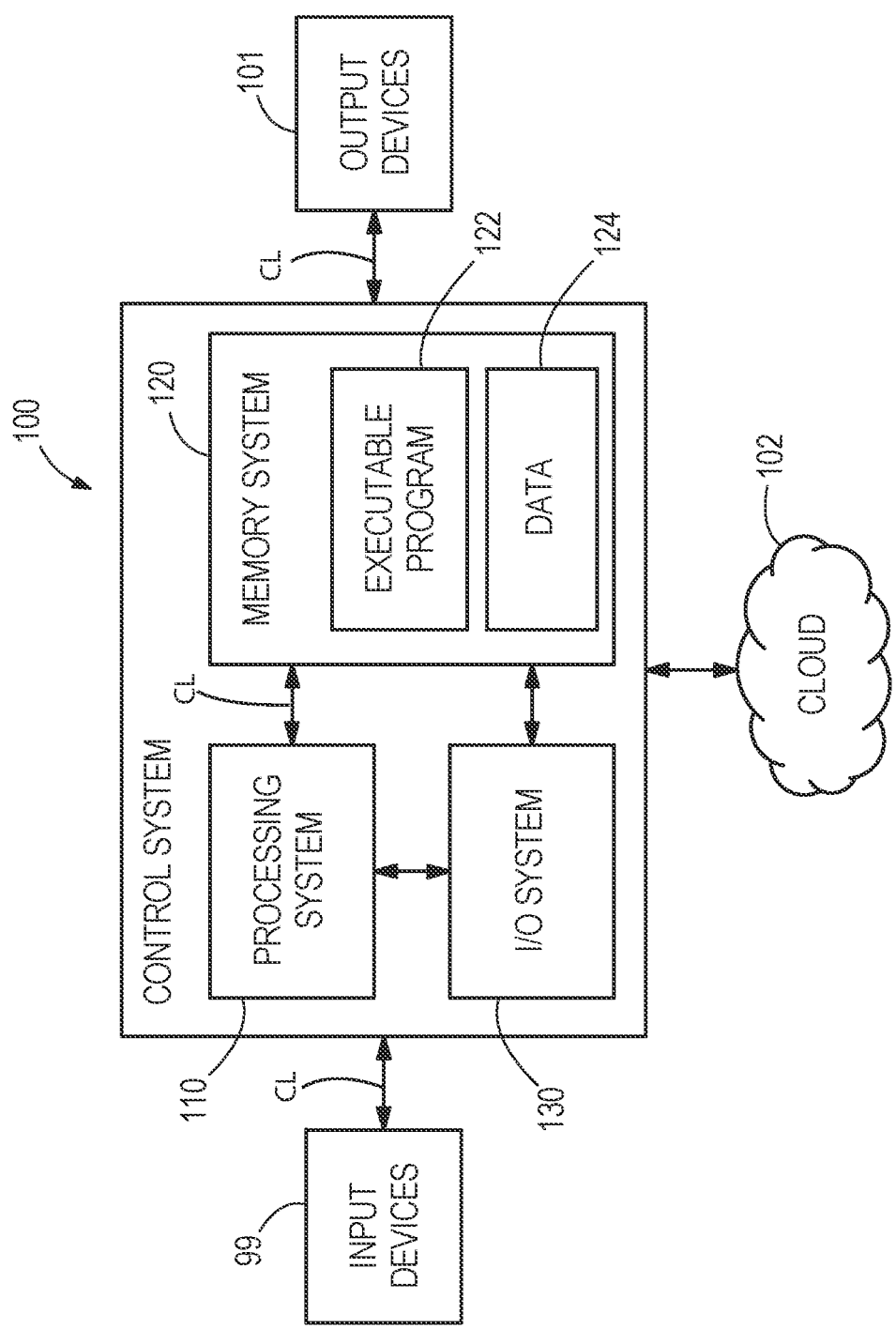
FIG. 2 is a schematic depicting one embodiment of an electrical system configured according to the present disclosure.

The control module 28 may be structured in the same or a similar manner as the exemplary control system 100 shown in FIG. 2. Certain aspects of the present disclosure are described or depicted as functional and/or logical block components or processing steps, which may be performed by any number of hardware, software, and/or firmware components configured to perform the specified functions. For example, certain embodiments employ integrated circuit components, such as memory elements, digital signal processing elements, logic elements, look-up tables, or the like, configured to carry out a variety of functions under the control of one or more processors or other control devices. The connections between functional and logical block components are merely exemplary, which may be direct or indirect, and may follow alternate pathways.

In certain examples, the control system 100 communicates with each of the one or more components of the marine vessel 12 via a communication links CL, which can be any wired or wireless link. The control system 100 is capable of receiving information and/or controlling one or more operational characteristics of the marine vessel 12 and its various sub-systems by sending and receiving control signals via the communication links CL. Some of the communication links CL are shown coinciding with the lines 54 providing power as shown in FIG. 1. In one example, the communication links CL include a controller area network (CAN) bus; however, other types of links could be used. It should be recognized that the connections and communication links CL may in fact be one or more shared connections, or links, among some or all of the components in the marine vessel 12. Moreover, the drawn depictions of communication links CL and lines 54 are meant only to demonstrate that the various control elements are capable of communicating with one another, and do not represent actual wiring connections between the various elements, nor do they represent the only paths of communication between the elements. Additionally, the marine vessel 12 may incorporate various types of communication devices and systems, and thus the illustrated communication links CL may in fact represent various different types of wireless and/or wired data communication systems.

The control system 100 may be a computing system that includes a processing system 110, memory system 120, and input/output (I/O) system 130 for communicating with other devices, such as input devices 99 and output devices 101, either of which may also or alternatively be stored in a cloud 102. The processing system 110 loads and executes an executable program 122 from the memory system 120, accesses data 124 stored within the memory system 120, and directs the components of the marine vessel 12 to operate as described in further detail below.

The processing system 110 may be implemented as a single microprocessor or other circuitry, or be distributed across multiple processing devices or sub-systems that cooperate to execute the executable program 122 from the memory system 120. Non-limiting examples of the processing system include general purpose central processing units, application specific processors, and logic devices.

The memory system 120 may comprise any storage media readable by the processing system 110 and capable of storing the executable program 122 and/or data 124. The memory system 120 may be implemented as a single storage device, or be distributed across multiple storage devices or sub-systems that cooperate to store computer readable instructions, data structures, program modules, or other data. The memory system 120 may include volatile and/or non-volatile systems, and may include removable and/or nonremovable media implemented in any method or technology for storage of information. The storage media may include non-transitory and/or transitory storage media, including random access memory, read only memory, magnetic discs, optical discs, flash memory, virtual memory, and non-virtual memory, magnetic storage devices, or any other medium which can be used to store information and be accessed by an instruction execution system, for example.

The present inventors recognized problems with electrical systems of marine vessels presently known in the art. In particular, as technology advances, the number of electrical components within a marine vessel keeps growing. Increasingly, marine vessels are required to provide the same comforts as homes and automobiles. The power requirements for a marine vessel also increase due to the addition of these components, also requiring additional cabling and connections between these devices and the control module and/or power source (also referred to collectively as "lines" for simplicity).

Due to the addition of these components and cabling, there are significantly more failure points in a modern electrical system, which could be missed during the assembly process or fail during the life of the marine vessel. Existing processes to identify loose connections and failure points in the electrical system rely on manufacturing process control (e.g., torque specifications, work instructions, quality inspections, etc.). These techniques can be inaccurate or problematic for several reasons, including torque tools being out of calibration or not used, work instructions being out of date, or simply from inspectors being subject to human error, for example.

Moreover, the safeguards presently employed only seek to prevent issues during the assembly process. Once the marine vessel leave the manufacturing facility, there are typically no further inspections of the marine vessel in operation. Additionally, the present inventors have recognized that in some cases there is no way physically access the connection point after assembly is completed, rendering troubleshooting very challenging and or even impossible. Furthermore, marine vessels are particularly vulnerable to issues within the electrical system, which can be impacted by the physical movement of the vessel when underway, the damp conditions, extreme environmental conditions, and corrosion from salt water, for example.

In addition, the present inventors have also recognized a desire to continue simplifying the operation of the marine vessel for the operator. As the number of components continues to increase, the ability of an operator to understand all of the components and provide basic troubleshooting of problems becomes more challenging. However, the present inventors have further recognized that the increased integration of these high-tech components has created a new opportunity for improvement not presently recognized in the art. In particular, the present inventors have recognized that the digital switching systems that have become prevalent among components or powered devices within marine vessels can be exploited to manage and troubleshoot the issues discussed above, while also simplifying operation.

Certain powered devices 44 known in the art incorporate digital switching systems that can detect whether there is voltage present at that digitally controlled switch, and/or can monitor the flow of current therethrough. Examples of digital distribution or digital switching systems currently available in the market include the COI Module by Czone, NXT DCM11 Module by Expirbus, and the 426HSS Module by E-Plex. Some powered devices 44 having digital switching systems can go further by allowing alarms to be set when a voltage and/or current is not detected. However, these alarms act independently for each powered device 44. In other words, each powered device 44 outfitted with a digitally controlled switch generates an alarm based only on its own detected voltage and/or current values, irrespective of the state of the power source, or the voltage and/or current values of other components. As such, no alarm or troubleshooting information is provided at an enterprise level, and thus prior art systems are not capable of detecting faults between components. In this manner, detecting and troubleshooting faults between components can only be performed manually during the manufacturing process, as discussed above.

Figure 3:
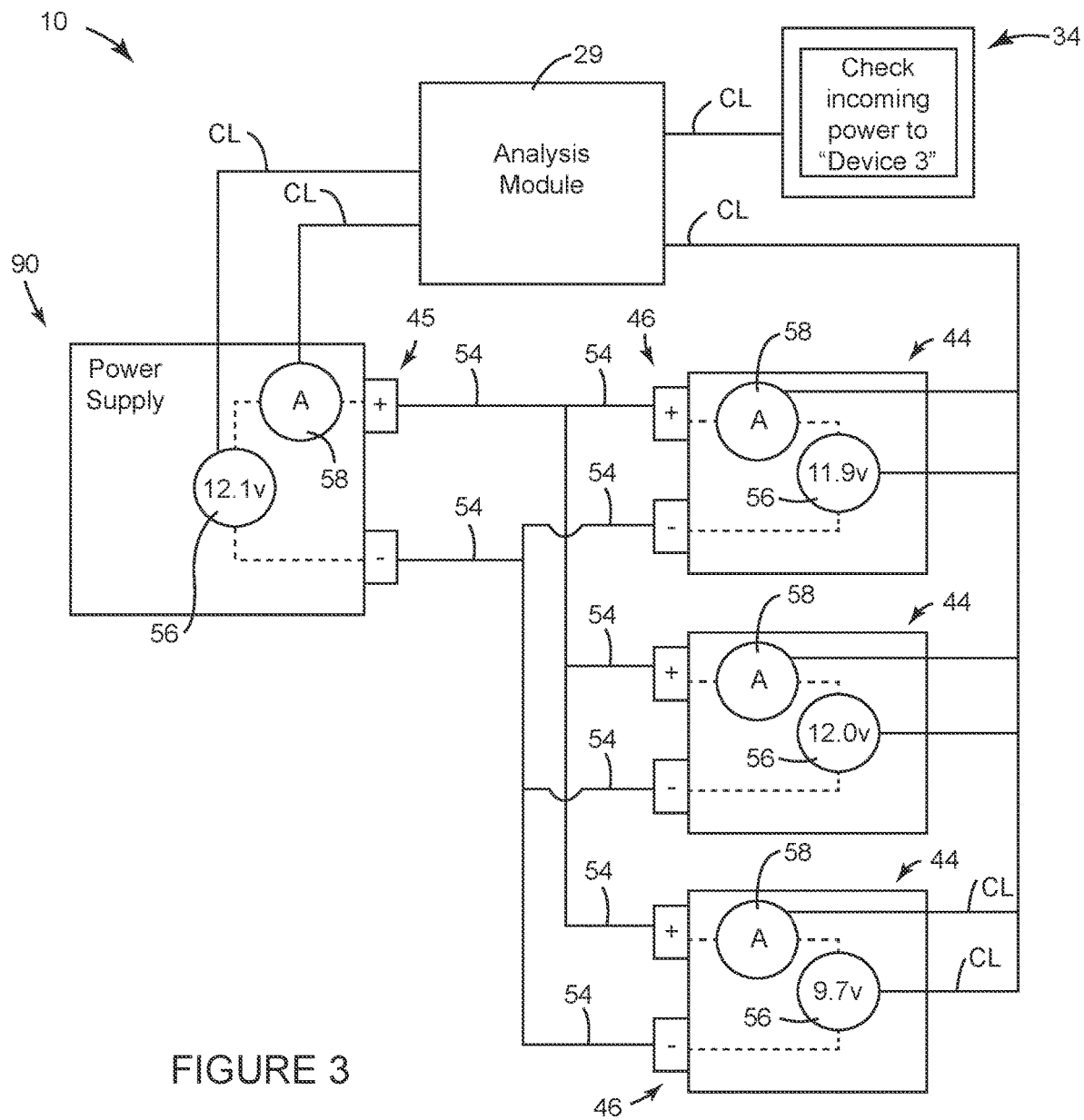
FIG. 3 is a schematic depicting another embodiment of an exemplary electrical system configured according to the present disclosure.
Figure 4:
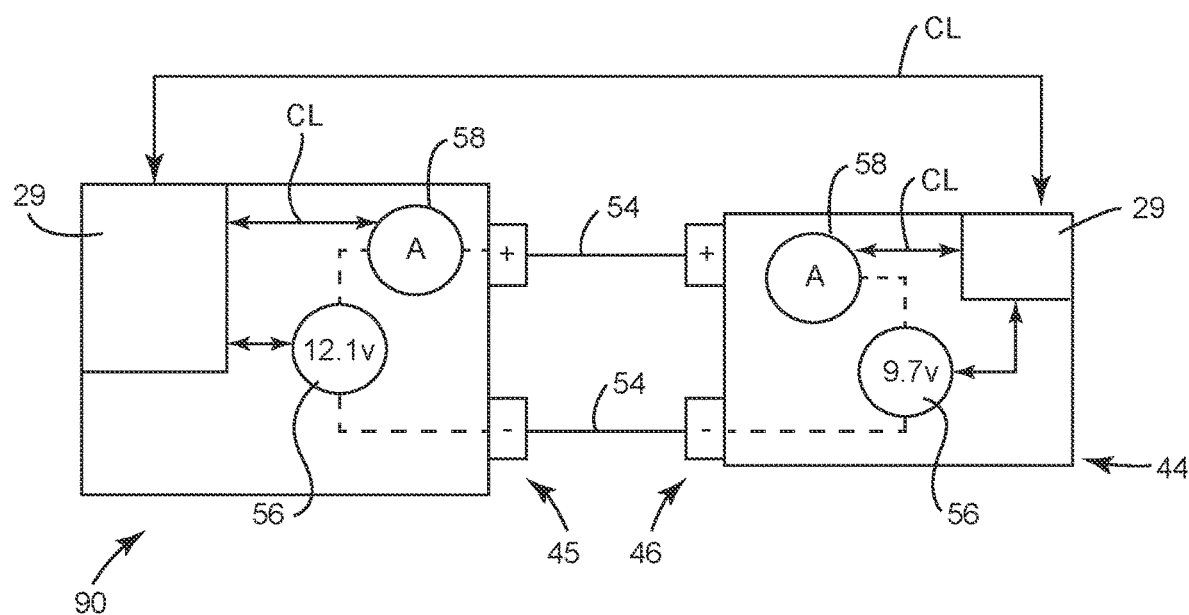
FIG. 4 depicts an exemplary control system such as may be incorporated within the electrical system of FIG. 1 according to the present disclosure.

As shown in FIGS. 3 and 4, the presently disclosed electrical systems 10 provide for detecting faults between components (e.g., a power supply 90 and a powered device 44) by detecting, communicating, and comparing the power information thereof. In the electrical system 10 of FIG. 3, the power supply 90 receives or generates power in a manner known in the art or otherwise described above and produces an output of power at output connections 45. This output from the power supply 90 may nominally be 12.0 VDC as shown, and/or other voltages 120.0 VAC, for example. The output connections 45 are connected via lines 54 to input connections 46 for three separate powered devices 44 to provide power thereto. It should be recognized that current output varies dependent on loads applied to the system, the size of vessel, and the like. Some larger vessels may have a maximum typical momentary current (less than 5 minutes on) of 175-200 Amps, and a 50-80 Amp maximum continuous operating current, for example.

A voltage sensor 56 such as those presently known in the art is associated with the power supply 90 detects a voltage across the output connections 45 in a manner known in the art. A current sensor 58 such as those presently known in the art is also associated with the power supply 90. The current sensor 58 detects a current flowing through the output connections 45 in a manner known in the art. The current sensors 58 may also or alternatively measure the current through the power supply 90, including via any input connections thereof (not shown).

Voltage sensors 56 and/or current sensors 58 may also be provided in associated with one or more of the powered devices 44, which are configured to detect voltages and currents corresponding thereto. Specifically, the voltage sensors 56 of the powered device s44 measure the voltage across the input connections 46 and the current sensors 58 of the powered devices 44 measure the current entering the input connections 46. The current sensors 58 may also or alternatively measure the current through the powered devices 44, including to any outputs connections thereof (not shown). The voltage sensors 56 and/or current sensors 58 need not be integrated directly within the power supply 90 and powered devices 44 (e.g., either may be a stand-alone device electrically coupled in a manner known in the art). Likewise, it is not necessary for components to have both a voltage sensor 56 and a current sensor 58.

In the example shown in FIG. 3, the voltage sensor 56 of the power supply 90 has detected a voltage of 12.1V. Similarly, the powered devices 44 from top to bottom have detected voltages of 11.9V, 12.0V, and 9.7V, respectively. As discussed above, some components (or powered device 44) known in the art are configured to measure such voltages, and also to produce an alarm when the detected voltage is outside a threshold range. For example, a default alarm may occur when the detected voltage is below a threshold of 11.0V for a system in which a nominal value of 12.0V is expected.

If FIG. 3 showed an electrical system as known in the art, there would be no communication or comparison of the various voltages and/or currents detected at the power supply or powered devices (including no analysis module 29, discussed further below). Therefore, absent the complete view of the electrical system, an incorrect conclusion would be reached. In particular, the 9.7V detected by the bottom powered device 44, functioning alone, would produce an alarm presuming a low battery state or otherwise underperforming power supply 90. However, the present inventors have recognized that if the voltage detected for the bottom powered device 44 were compared to the voltage detected for the power supply 90, and/or to the voltages of the top or middle powered devices 44, it would be apparent that a low battery state is not in fact present for the power supply 90. In other words, the voltage sensor 56 of the power supply 90 confirms that a voltage of 12.1V is being produced at the output connections 45 (being within threshold of +1.0 V of a nominal 12.0V, for example). Likewise, other powered devices 44 are receiving voltages that are within the threshold indicating normal battery state.

To this end, the present inventors have designed the electrical system 10 of FIG. 3 to include an analysis module 29 that communicates with the powered devices 44 and the power supply 90. As is discussed further below, the analysis module 29 therefore serves as a supervisor of the power supply 90 and powered devices 44 to provide comparison and, in certain cases, consequent action.

The analysis module 29 may be incorporated within the control module 28 (FIG. 1), may be separate from the control module 28 but still a single centralized device (FIG. 3), may be embodied as separate analysis modules 29 provided with the power supply 90 and one or more of the powered devices 44 (provided with joystick 38 in FIG. 1), and/or may be incorporated directly within the power supply 90 and one or more powered device 44 (FIG. 4). Like the control module 28 discussed above, each analysis module 29 may be structured in the same manner as the control system 100.

The analysis module 29 receives the voltages detected by the voltage sensors 56 (and/or the currents detected by the current sensors 58) from each component connected thereto, which here is the power supply 90 and multiple powered devices 44. A standard communication protocol in the marine industry is NMEA 2000, as well as J1939 for engine communication. The analysis module 29 is further configured to determine a difference between the output of the power supply 90 and the incoming power received by the powered devices 44, for example a subtraction of voltages: subtracting the incoming power (e.g. voltage) detected by the voltage sensor 56 of a given powered device 44 from the output power detected by the voltage sensor 56 of the power source.

The analysis module 29 is further configured to compare this difference to a threshold. For example, the threshold may be set to a range of +1.1V for voltages, and/or 2.0 A for current. In another example, the threshold is determined based on the equation below:

$$E=(K \times I \times L)/(CM), \text{ where}$$

K=COPPER RESISTIVITY @ 10.75
I=CURRENT
L=LOOP LENGTH (in feet), which is the distance measured along the length of the conductor from the positive connection, through the device, and back to the negative connection
CM=CIR MILLS
E=MAXIMUM ALLOWABLE DROP IN VOLTS AT LOAD It should be recognized that K, L, and CM are constants known at the time of building. The current I is obtained by the powered devices 44 monitoring the current therethrough. The actual voltage between the powered devices 44 is compared to the result of the equation above, whereby the actual measured value should not exceed the calculated value E by a determined tolerance (e.g., 1%, 2%, 3%, 5%, or 10%).

The analysis module 29 may also or alternatively compute the difference between the power supply 90 and each of the powered devices 44 as a percentage. For example, the difference may be calculated by subtracting the incoming power detected by the voltage sensor 56 of a given powered device 44 from the output power detected by the voltage sensor 56 of the power source, divided by the output power detected by the voltage sensor 56 of the power source. In this case, the threshold may be set to +3% or 10%, for example, or other values depending on the sensitivity of the powered devices 44, distance between the power supply 90 and the powered devices 44, and/or other factors. By way of example, the threshold is selected to provide for a tolerance in metering inaccuracies between 2% and 5%.

It should be recognized that other algorithms may also be used for comparing the voltages of the power supply 90 and the powered devices 44, including integrating the differences over time, for example.

If the analysis module 29 determines that the measured incoming power at the incoming connection of any powered device 44 is not within the allowed threshold e.g., the difference between the measurement of the power supply 90 and the powered device is too great), a signal is generated to indicate that the threshold has been exceeded. For example, the signal may be sent from the analysis module 29 to the multi-functional display device 34 at the helm 32 (FIG. 1) to display a visual and/or generate an audible warning that a fault is occurring between the power supply 90 and the powered device 44. In certain embodiments, the signal and consequent visual and/or audible warning further indicates to the operator which of the powered devices 44 has a fault associated therewith, for example displaying "Electrical fault detected between the power supply and the GPS device".

In one example using percentages, the analysis module 29 causes an alert to occur at the helm 32 (using standard error signal protocols presently known in the art) when a DC to AC power inverter (as the powered device 44) is 20% (10.8V) below a nominal battery voltage of 13.5V (as the power supply 90) when drawing 1.0 A. Normally, an inverter presently known in the art would simply assume that the battery is at a low state of charge (SOC) and would continue to operate normally. However, this voltage drop means that there is 270 W of heat being generated somewhere between the battery and inverter. Therefore, if the power supply 90 is indeed operating as expected, this voltage drop may be caused by a loose battery terminal (other possibilities include the wiring and/or wire connections between the power supply 90 and powered device 44, for example). This power drop could cause the battery terminal to melt, causing permanent failure and potentially pose a hazard to the operator. When the analysis module 29 detects this discrepancy and generates the alarm, the operator knows there is an issue and can turn off the inverter and/or locate the loose terminal to re-tighten, thereby preventing the permanent failure and hazard condition.

Additionally, or alternatively, the inverter itself can be notified via the alert that it has a bad connection (and not that the battery is just at a low SOC). In this case, the inverter may automatically shutdown to prevent the failure/hazard condition. In certain embodiments, the analysis module 29 (itself or through the control module 28 of FIG. 1) may cause the faulting powered device 44, or even parts of the power supply 90, to shut down to protect the electrical system 10 and occupants of the marine vessel 12. In further embodiments, the analysis module 29 and/or control module 28 may cause the powered device 44 and/or power supply 90 to operate differently, rather than entirely shutting, in recognition of the fault state. This may be a selective process, for example disabling discretionary or entertainment-based features such as an audio/visual system or ambient lighting to minimize the load on the entire electrical system 10. A table of preferences and hierarchy of operation may be stored in the memory system 120 of the control system 100, for example.

It should be recognized that the signal and subsequent warning described above may be in addition to those presently known in the art that act independently for each device. In other words, a second signal may still result when a component itself detects an unacceptable measurement. For example, the power supply 90 may generate a second signal when the voltage sensor 56 detects a voltage that is not within specification for the voltage at its output connection 45. As another example, a second signal may be generated by the power supply 90 (in some cases relaying a signal from the powered device 44 itself) when the powered device 44 has a current sensor 58 detecting a current that exceeds a given threshold. In one particular example, the characteristics of the conductor are known and the maximum current values associated therewith programmed into the electrical system 10. Using this information, the threshold is exceeded if the measured current through the conductor exceeds the maximum current allowed plus 25% continuously (greater than 5 minutes).

In certain embodiments, the analysis module 29 is further configured to generate a signal only after a certain threshold time has passed in which the calculated difference in voltage and/or current is outside the threshold range. For example, the analysis module 29 may be configured to generate an alarm only after the difference in voltage exceeds the voltage-based threshold for at least two seconds as the time threshold.

Figure 5:
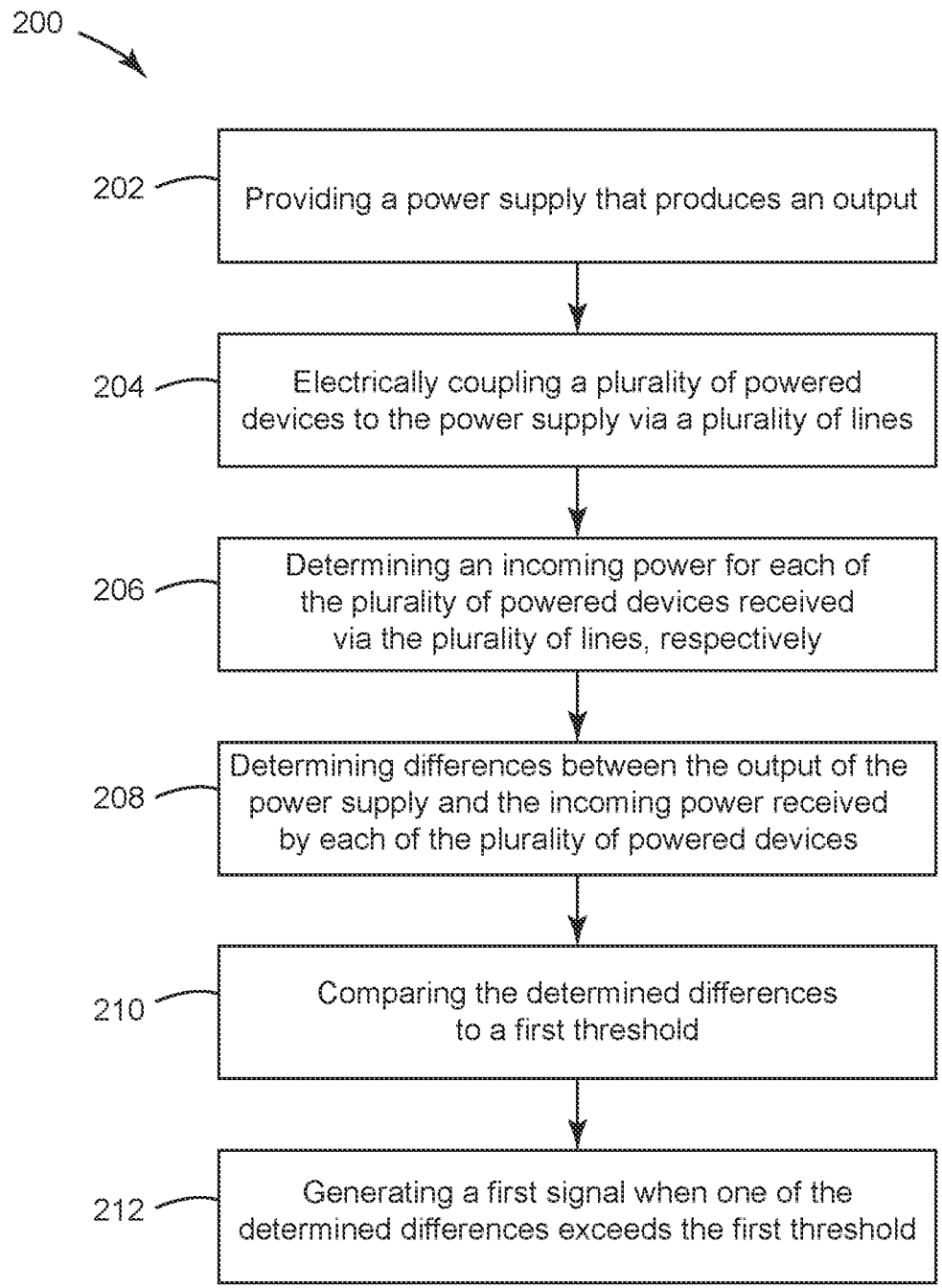
FIG. 5 depicts an exemplary method for monitoring an electrical system according to the present disclosure.

FIG. 5 depicts an exemplary method 200 for monitoring an electrical system 10 such as shown in FIGS. 3 and 4. The process begins with providing a power supply in step 202 that produces an output, then electrically coupling powered devices to the power supply via lines in step 204. Step 206 provides for determining an incoming power (voltage and/or current) at the incoming connections of the powered devices. Step 208 provides for determining the differences between the output of the power supply and the incoming power received by each of the powered devices. The differences are then compared in step 210 to a threshold, as discussed above. If the differences do in fact exceed the allowable threshold, step 212 provides for generating a signal that the threshold has been exceeded.

With reference to FIG. 3, the present inventors have identified that it would be further advantageous for the analysis module 29 to save the voltages and/or currents detected for the power supply 90 and powered devices 44 over time, and further to generate trends of this information. This trending may be performed on the respective measurements directly, or based on the differences determined between components in the manner described above. For example, the trend may include a median voltage detected across the input connection 46 of a given powered device 44 over time, an average current through the powered device 44 when in operation (or when being operated in a particular operating mode), and/or an average current through the powered device 44 when off or in standby mode. In addition to displaying these trends (e.g., on the multi-functional display device 34), the analysis module 29 may use this trending information to identify further issues with the electrical system 10.

To this end, additional thresholds may also be provided for changes to each of the detected values over time. For example, if the difference between the power supply 90 and a given powered device 44 changes by more than a third threshold, a further signal may be provided to indicate this change to the user. The third threshold may be a fixed amount such as 0.5V or 0.5 A, or a relative percentage of deterioration (e.g., a threshold of 10% change in the difference). It should be noted that a given powered device 44 may still be receiving an incoming power that is within a normal range (in other words, not triggering any absolute or difference-based thresholds in that moment), but still trigger a threshold relating to changes over time.

The present inventors have recognized that this additional trending can provide advanced notice to the user that the powered device 44 (or line 54 connecting it to the power supply 90) is deteriorating. The operator then has the opportunity to remedy the issue before damage occurs to the powered device 44, an electrical fire is started, and/or the powered device 44 fails in use (e.g., a GPS device ceasing to function while under way). In certain cases, the analysis module 29 detecting a deteriorating trend may result in a notice that the operator should have a particular powered device 44 (and/or lines 54 provided thereto) inspected at the next scheduled maintenance appointment, rather than acting as a "check engine light" urging immediate attention. However, both types of notice to the operator are anticipated by the present disclosure, which may both be present and employed based on the severity of the issue and/or criticality of the powered device 44, for example.

Likewise, deterioration of multiple powered devices 44 may further indicate a different root cause than the individual powered devices 44 or the individual lines 54 thereto failing. For example, the analysis module 29 in this case could determine that a fault is likely to be upstream of the individual lines 54, since the deterioration is affecting them both.

In certain examples, artificial intelligence (AI) and/or advanced statistical analysis may be incorporated within the analysis module 29 to further identify and predict issues within the electrical system 10. In this manner, analysis module 29 may identify a relationship between different powered devices 44. For example, an unexpectedly large change in the current through a first of the powered devices 44 after a second of the powered devices 44 is turned on may indicate issues with the second of the powered devices 44, the power supply 90, and/or any of the lines 54 therebetween. In particular, the present inventors have recognized that the current ramp up times can be determined by the electrical system 10 and compared over time. A change in the current ramp up time, or a sharper and longer voltage drop at the time the circuit is closed, can be a predictor of need for future maintenance, which can be reported to the operator and/or automatically added to a repair schedule. In further examples, trending information may be shared across different marine vessels 12 (for example, when serviced) to provide earlier prediction of issues with components failing in the field. In this case, trending information from different marine vessels 12 may be incorporated and analyzed via another analysis module similar to the analysis module 29, now provided in a centralized location. The present inventors have recognized that differences in the data collected across various vessels constructed at different times can also provide an indication of any changes in manufacturing tolerances (e.g., declining quality). Furthermore, this can be compared to personnel work schedules to identify the employee assigned to the task where the decline in quality is noted. This can be used for personalized training to improve skill levels, improving quality while also providing a career improvement path for individual employee growth.

In this manner, the presently disclosed systems and methods provide safeguards for powered devices 44 in electrical systems 10 of new or existing marine vessels 12, including the detection of energy transfer faults to loads via networked digital switching devices (i.e., powered devices 44). As discussed above, this improves the ability of an operator to detect and troubleshoot problems, provides early warning of deterioration, and increases the safety of the operator.

The functional block diagrams, operational sequences, and flow diagrams provided in the Figures are representative of exemplary architectures, environments, and methodologies for performing novel aspects of the disclosure. While, for purposes of simplicity of explanation, the methodologies included herein may be in the form of a functional diagram, operational sequence, or flow diagram, and may be described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology can alternatively be represented as a series of interrelated states or events, such as in a state diagram. Moreover, not all acts illustrated in a methodology may be required for a novel implementation.

This written description uses examples to disclose the invention, including the best mode, and also to enable any person skilled in the art to make and use the invention. Certain terms have been used for brevity, clarity, and understanding. No unnecessary limitations are to be inferred therefrom beyond the requirement of the prior art because such terms are used for descriptive purposes only and are intended to be broadly construed. The patentable scope of the invention is defined by the claims and may include other examples that occur to those skilled in the art. Such other examples are intended to be within the scope of the claims if they have features or structural elements that do not differ from the literal language of the claims, or if they include equivalent features or structural elements with insubstantial differences from the literal languages of the claims.

What is claimed is:

1. An electrical system for a marine vessel, the electrical system comprising:
    a power supply that produces an output voltage;
    a plurality of powered devices electrically coupled to the power supply to receive a plurality of incoming voltages therefrom, respectively; and
    an analysis module that determines a plurality of differences between the output voltage of the power supply and the plurality of incoming voltages received by the plurality of powered devices, respectively, wherein the analysis module further compares the plurality of differences to a first threshold and generates a first signal when at least one of the plurality of differences exceeds the first threshold, wherein the first signal causes generating an alert indicating which of the plurality of powered devices corresponds to exceeding the first threshold and changing an operation of the which of the plurality of powered devices corresponds to exceeding the first threshold while maintaining an operation of another powered device within the plurality of powered devices for which the first threshold is not exceeded.

2. The electrical system according to claim 1, wherein the plurality of powered device receives the plurality of incoming voltages from the power supply via a plurality of lines, and wherein the first signal indicates for which among the plurality of lines maintenance is needed.

3. The electrical system according to claim 1, wherein the analysis module is also coupled to the power supply as part of one powered device within the plurality of powered devices.

4. The electrical system according to claim 1, wherein the differences determined by the analysis module are measured in voltage.

5. The electrical system according to claim 1, wherein the analysis module is further configured to determine a change in at least one of the output voltage and the plurality of incoming voltages over time, to compare the change to a third threshold, and to generate a third signal when the change exceeds the third threshold.

6. The electrical system according to claim 1, wherein the analysis module is configured to communicate with a graphical user interface, and wherein the first signal is configured to cause the graphical user interface to display the alert.

7. An electrical system for a marine vessel, the electrical system comprising:
    a power supply that produces an output voltage;
    a plurality of powered devices electrically coupled to the power supply to receive a plurality of incoming voltages therefrom, respectively; and
    an analysis module that determines a plurality of differences between the output voltage of the power supply and the plurality of incoming voltages received by the plurality of powered devices, respectively, wherein the analysis module further compares the plurality of differences to a first threshold and generates a first signal when at least one of the plurality of differences exceeds the first threshold, wherein the first signal causes generating an alert indicating which of the plurality of powered devices corresponds to exceeding the first threshold and changing an operation of the which of the plurality of powered devices corresponds to exceeding the first threshold;
    wherein the plurality of powered devices is further configured to compare the plurality of incoming voltages to a second threshold and to generate a second signal when at least one of the plurality of incoming voltages is below the second threshold that indicates which among the plurality of powered devices corresponds thereto.

8. An electrical system for a marine vessel, the electrical system comprising:
    a power supply that produces an output voltage;

a plurality of powered devices electrically coupled to the power supply to receive a plurality of incoming voltages therefrom, respectively; and an analysis module that determines a plurality of differences between the output voltage of the power supply and the plurality of incoming voltages received by the plurality of powered devices, respectively, wherein the analysis module further compares the plurality of differences to a first threshold and generates a first signal when at least one of the plurality of differences exceeds the first threshold, wherein the first signal causes generating an alert indicating which of the plurality of powered devices corresponds to exceeding the first threshold and changing an operation of the which of the plurality of powered devices corresponds to exceeding the first threshold;

wherein the analysis module is further configured to determine a change in at least one of the output voltage and the plurality of incoming voltages over time, to compare the change to a third threshold, and to generate a third signal when the change exceeds the third threshold; and wherein when the change within the plurality of incoming voltages is determined to exceed the third threshold, the third signal indicates that maintenance is needed for a corresponding powered device within the plurality of powered devices.

9. A method for monitoring an electrical system for a marine vessel, the method comprising:

providing a power supply that produces an output voltage;

electrically coupling a plurality of powered devices to the power supply;

determining an incoming voltage for each of the plurality of powered devices received;

determining differences between the output voltage of the power supply and the incoming voltage received by each of the plurality of powered devices; and comparing the determined differences to a first threshold and generating a first signal when one of the determined differences exceeds the first threshold, wherein the first signal causes generating an alert indicating which of the plurality of powered devices corresponds to exceeding the first threshold and changing an operation of the which of the plurality of powered devices corresponds to exceeding the first threshold while maintaining an operation of another powered device within the plurality of powered devices for which the first threshold is not exceeded.

10. The method according to claim 9, wherein the first signal indicates that maintenance is needed.

11. The method according to claim 9, further comprising configuring each of the plurality of powered devices to compare the incoming voltage received thereby to a second threshold and to generate a second signal when the incoming voltage is below the second threshold.

12. The method according to claim 9, further comprising configuring a plurality of analysis modules each associated with one of the plurality of powered devices to determine the incoming voltage being received.

13. The method according to claim 9, further comprising determining changes in the incoming voltage for each of the plurality of powered devices over time, comparing each of the changes to a third threshold, and generating a third signal when one of the changes exceeds the third threshold.

14. The method according to claim 13, wherein when the one of the changes exceeds the third threshold, the third signal indicates which of the plurality of powered devices corresponds to the one of the changes exceeding the third threshold.

15. The method according to claim 9, wherein the first signal causes a user interface to display the alert.

* * * * *